(12) United States Patent
Sassa et al.

(10) Patent No.: US 6,460,145 B1
(45) Date of Patent: Oct. 1, 2002

(54) STORAGE DEVICE DATA PROCESSING SYSTEM AND DATA WRITING AND READOUT METHOD

(75) Inventors: Akira Sassa, Saitama; Takumi Okaue, Kanagawa; Mitsuhiro Hirabayashi, Tokyo, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/162,327

(22) Filed: Sep. 28, 1998

(30) Foreign Application Priority Data

Sep. 30, 1997 (JP) ............................................. 9-267172

(51) Int. Cl.7 ................................................ G06F 11/00
(52) U.S. Cl. ......................................................... 714/5
(58) Field of Search ............................. 714/5, 8, 6, 20, 714/52, 54, 758, 766

(56) References Cited

U.S. PATENT DOCUMENTS

| | | | |
|---|---|---|---|
| 5,448,577 A | | 9/1995 | Wells et al. ................ 371/40.1 |
| 5,485,595 A | * | 1/1996 | Assar .......................... 711/103 |
| 5,602,987 A | * | 2/1997 | Harari et al. ............... 365/200 |
| 5,802,551 A | * | 9/1998 | Komatsu ..................... 711/103 |
| 5,838,614 A | * | 11/1998 | Estakhri ................. 365/185.11 |
| 5,857,069 A | * | 1/1999 | Kohler .......................... 714/5 |
| 5,987,563 A | * | 11/1999 | Itoh ............................. 71/103 |
| 6,119,245 A | * | 9/2000 | Hiratsuka ............... 365/185.09 |
| 6,219,768 B1 | * | 4/2001 | Hirabayashi et al. ........ 711/103 |
| 6,223,308 B1 | * | 4/2001 | Estakhri et al. ............. 711/103 |

FOREIGN PATENT DOCUMENTS

| | | |
|---|---|---|
| DE | 3541 115 | 5/1987 |
| EP | 0 597 706 | 5/1994 |
| EP | 0 669 751 | 8/1995 |
| FR | 2 687 811 | 8/1993 |
| FR | 2 730 833 | 8/1996 |

* cited by examiner

*Primary Examiner*—Robert Beausoleil
*Assistant Examiner*—Bryce P. Bonzo
(74) *Attorney, Agent, or Firm*—Frommer Lawrence & Haug LLP; William S. Frommer; Darren M. Simon

(57) ABSTRACT

There are provided a storage device for outputting-data in such a manner that whether or not error correction has been made can be discriminated, and a data processing system in which a storage device furnishes data to a data processing device in such a manner that whether or not the area management information has been corrected for errors can be discriminated and in which the data processing device discriminates whether or not the area management information has been corrected for errors in order to perform predetermined data processing. There is also provided a data processing method for the storage device and for the data processing system. If there is any error correctable by an error processing unit 26 in the area management information read out from the flash memory 21, the controller 27 furnishes the area management information to the error correction processing unit 26 and appends a flag indicating the fact of error correction to the area management information corrected for errors to output the resulting data.

14 Claims, 9 Drawing Sheets

POSSIBLE / NOT POSSIBLE FLAG : [1] ↔ [1111 1111] [USABLE]
[0] ↔ [0000 0000] [NOT USABLE]

BLOCK FLAG : [1 1] ↔ [1111 1111] [NOT IN USE]
[1 0] ↔ [1111 0000] [LEADING END IN USE]
[0 1] ↔ [0000 1111] [IN USE]
[0 0] ↔ [0000 0000] [NOT ERASED]

LAST FLAG : [1] ↔ [1111] [BLOCK CONTINUOUS]
[0] ↔ [0000] [BLOCK LAST]

REFERENCE FLAG : [1] ↔ [1111] [NO REFERENCE INFORMATION]
[0] ↔ [0000] [REFERENCE INFORMATION]

AREA MANAGEMENT INFORMATION ⟶ AREA MANAGEMENT FLAG

FIG.5

STORAGE DEVICE DATA PROCESSING SYSTEM AND DATA WRITING AND READOUT METHOD

BACKGROUND OF THE INVENTION

1. Field of the Invention

This invention relates tog a storage device for storage of optional data and the area management information for supervising the state of the area in which to store the data, a data processing system and a data processing method employing this storage device.

2. Description of the Related Art

Up to now, a card type external storage device, referred to hereinafter as a memory card, employing a flash memory (electrically erasable programmable read-only memory (ROM)) as a recording medium, has been proposed as an external data storage device used for an electronic equipment.

In this memory card, optional data and the management information as ancillary data are stored in a memory, as a storage medium. When these data and the management information are sent from the memory card to e.g., a host side computer, the data or the management information is corrected for errors, using the error correction codes, to correct the data for errors produced by cell malfunctions, before outputting the data or information.

As the above management information, the information for management of the state of an area for data storage (area management information), such as the information specifying whether or not the area holding the data on memory is usable, is occasionally stored, in addition to the data-dependent information for supervising the data (data management information), such as logical addresses indicating the sequence of the stored data.

Since the area management information is the information concerning an in-memory area, that is information independent of data, there may arise the necessity of rewriting the information after storage of the data, and hence the area management information is usually adapted to be rewritten by itself without rewriting the data.

Also, if an error is produced in the area management information, and a usual error correction code is used to correct the information for errors, the error correction codes need to be rewritten every time the information is rewritten. Thus, for the area management information, the same information is desirably distributed in plural bits and stored in this state in order to combat errors without employing the error correction code for error correction.

Meanwhile, if the same information is distributed in plural bits and stored in this state to combat errors, the area management information occasionally cannot be corrected for errors on occurrence of malfunctions in plural cells in which the same information is stored. It is therefore desirable that the area management information once corrected for errors can be discriminated to be the information corrected for errors, so that, in case of storage in the memory card next time, the data will be stored in an area other than the area subjected to the malfunction.

SUMMARY OF THE INVENTION

It is therefore an object of the present invention to provide a storage device for outputting data in such a manner: that whether or not the area management information has been corrected for errors can be discriminated.

It is another object of the present invention to provide a data processing system in which a storage device sends data to a data processing device in such a manner that whether or not the area management information has been corrected for errors can be discriminated and in which the data processing device discriminates whether or not the area management information has been corrected for errors in order to perform defined data processing.

It is yet another object of the present invention to provide a data processing method used in the storage device and in the data processing system.

In one aspect, the present invention provides a storage device including storage means for storing data and the area management information for supervising the state of an area in which the data is stored, error correcting processing means for correcting the area management information for predetermined errors if such errors are present in the area management information read out from the storage means, and data processing means for reading the area management information from the storage means, supplying the area management information to the error correcting processing means if errors that can be corrected by the error correcting processing means are present in the area management information. The data processing means appends a flag specifying the fact of error correction to the area management information corrected for errors, and outputs the resulting information.

In the present storage device, if the area management information read from the storage means has errors correctable by error correction means, the data processing device sends the area management information to the error correction means and appends a flag indicating the fact of error correction to the area management information corrected for errors to output the corrected area management information.

In another aspect, the present invention provides a data processing system including a storage device for storing data and the area management information for supervising the state of an area in which the data is stored, and a data processing device for supplying data and the area management information to the storage device or receiving and processing the data and the area management information outputted by the storage device.

If the area management information stored in the storage device has correctable errors, the data processing system corrects the area management information for errors and appends a flag specifying the fact of error correction to the area management information corrected for errors to route the corrected area management information with the appended flag to the data processing device.

If a flag indicating the fact of error correction by the data processing device is appended to the area management information entered from the storage device, the data processing system recognizes, by the flag, that the input area management information is the information corrected for errors, in order to perform defined processing.

In yet another aspect, the present invention provides a data processing method including reading out data stored in storage means and the area management information in order to supervise the state of an area in which the data is stored, and correcting the area management information read out from the storage means for errors if the area management information has correctable errors, and outputting the corrected information with a flag indicating the fact of error correction appended thereto.

If a flag indicating the fact of error correction by the data processing device is appended to the area management information entered from the storage device, the data processing method recognizes, by the flag, that the input area management information is the information corrected for errors, in order to perform defined processing.

BRIEF DESCRIPTION OF THE DRAWINGS

FIG. 5 is a schematic view showing an example of an area management flag.

DESCRIPTION OF THE PREFERRED EMBODIMENTS

Figure 1:
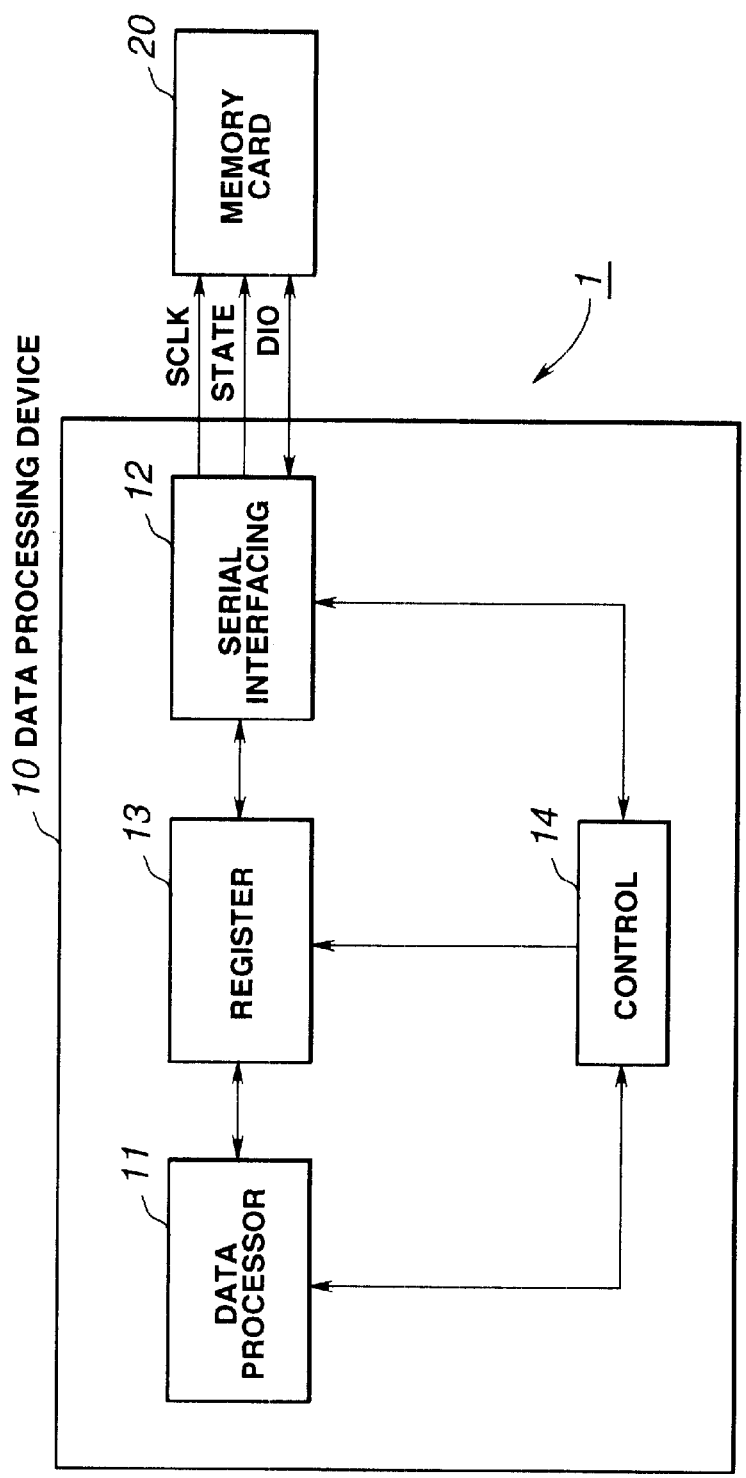
FIG. 1 is a block diagram Showing the structure of a data processing apparatus.

Referring to the drawings, preferred embodiments of the present invention will be explained in detail.

In an embodiment shown in FIG. 1, the present invention is applied to a system 1 made up of a data processing device 10 as a host-side device and a memory card 20 as an external storage device connected to this data processing device 10 via a serial interface.

Although the system shown herein is adapted to exchange data between the data processing device 10 and the memory card 20 via a serial interface, the present invention is also applicable to a system in which data exchange is via a parallel interface.

The data processing device 10, used in the present system 1, includes a data processing unit 11, for executing a defined program, a serial interfacing circuit 12 for exchanging data with the memory card 20 as the external device, a register 13 provided between the data processing unit 11 and the serial interfacing circuit 12 for transiently storing data sent from the data processing unit 11, and a controller 14 connected to the data processing unit 11, serial interfacing circuit 12 and to the register 13 for controlling the processing by these components.

If, when the data processing unit 11 executes a defined program, the data processing device 10 has found that data needs to be stored in the memory card 20 as the external storage device, the data processing unit 11 writes data for storage, management information required for supervising the data or control data such as write commands in the register 13 under control by the controller 14.

The serial interfacing circuit 12 reads out the data for storage, management information or the write commands from the register 13, under control by the controller 14, and converts them into serial data which is transferred along with clock signals and status signals. The management information is made up of the data management information as the information for supervising the data and the area management information for supervising the status of areas in which to store the data.

Also, if the data processing unit 11 of the data processing device 10 finds that, for executing a defined program, data needs to be read from the memory card 20 as the external storage device, the data processing unit 11 writes the readout command as the control data in the register 13 under control by the controller 14. The serial interfacing circuit 12 reads out the readout command from the register 13, under control by the controller 14, to transfer the serial data along with clock signals and the status signals.

The data or the management information, transferred from the memory card 20 in accordance with the readout command, is converted by the serial interfacing circuit 12 into parallel data, which is written in the register 13. The data processing unit 11 reads out these defined data or the management information from the register 13, under control by the controller 14, in order to effectuate the processing. At this time, the controller 14 discriminates the state of the area management information transmitted from the memory card 20 from a flag appended to the information as later explained in order to effectuate defined data processing.

There is no particular limitation to the data processing device used in the system of the present invention provided that it enables data exchange with the external storage device, such as memory card 20. Thus, a variety of data processing devices, such as personal computers, digital still cameras or digital video cameras, may be used.

In the present system 1, the data processing device 10 and the memory card 20 are interconnected over a serial interface, specifically, over at least three data lines SCLK, State and DIO. That is, the data processing device 10 and the memory card 20 are interconnected at least by a first data line SCLK for transmitting clock signals during data transmission, a second data line State for transmitting status signals required for data transmission, and a third data line DIO for serially transmitting data written in the memory card 20 or data read out from the memory card 20, in order to exchange data via these data lines.

It is noted that data is exchanged between the data processing device 10 and the memory card 20 in terms of a file usually composed of a header and real data as a unit. In the file header are stored the information for accessing to the file and the information required by a program executed by the data processing device 10.

Figure 2:
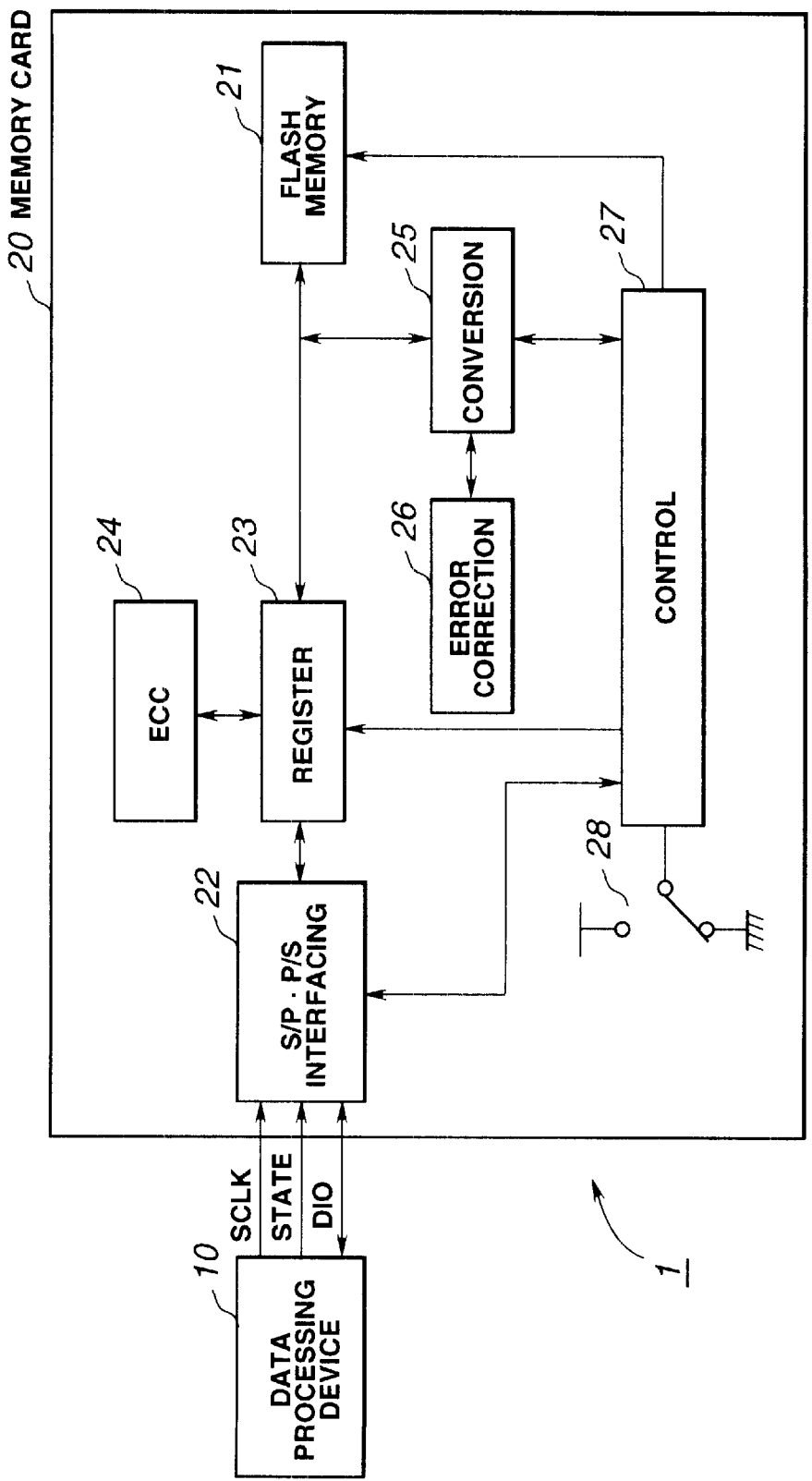
FIG. 2 is a block diagram showing the structure of a memory card.

Referring to FIG. 2, the memory card 20 includes a flash memory 21 for holding defined data or the management information on memory, and a serial/parallel-parallel/serial interfacing circuit (S/P-P/S interfacing circuit 22) for exchanging data with the data processing device 10. The memory card 20 also includes a register 23 provided between the flash memory 21 and the S/P-P/S interfacing circuit 22 for transient storage of data or the management information supplied from the S/P-P/S interfacing circuit 22 and an error correction circuit 24 connected to the register 23 to correct the data written in thee register 23 or the data management information for errors based on the error correction code. The memory card 20 also includes a converting unit 25 for converting the area management information read out from the register 23 into the information comprised of this area management information and redundant data appended thereto (termed herein the area management flag) or converting the area management flag read out from the flash memory 21 to the original area management information. The memory card 20 further includes an error correction unit 26 connected to this converting unit 25 for correcting an area management flag read out from the flash memory 21 for errors and a controller 27 connected to and adapted for controlling the processing operation of the flash memory 21, S/P-P/S interfacing circuit 22, register 23 and the converting unit 25.

The S/P-P/S interfacing circuit 22 is connected via at least the above-mentioned three data lines SCLK, State and DIO to the serial interfacing circuit 12 of the data processing device 10 in order to exchange data with the data processing device 10 via these data lines SCLK, State and DIO. That is, the S/P-P/S interfacing circuit 22 converts the serial data sent from the serial interfacing circuit 12 of the data processing device 10 into parallel data which is written in the register 23. The S/P-P/S interfacing circuit 22 also converts the parallel data read out from the register 23 to route the converted serial data to the serial interfacing circuit 12 of the data processing device 10. The serial data is transmitted between the S/P-P/S interfacing circuit 22 and the data processing device 10 over the first data line SCLK as synchronization is achieved by clock signals sent from the data processing device 10. At this time, the data type of the serial data exchanged over the third data line DIO is discriminated by the status signal exchanged over the second data line State. The data types may be enumerated by, for example, data to be stored in the flash memory 21, data read out from the flash memory 21 and control data for controlling the operation of the memory card 20.

If data sent from the data processing device 10 is control data, such as the write command or the readout command, the S/P-P/S interfacing circuit 22 routes the control data to the controller 27.

The register 23 transiently stores data exchanged between the flash memory 21 and the S/P-P/S interfacing circuit 22.

The error correction circuit 24 appends error correction codes to data written in the register 23 by the S/P-P/S interfacing circuit 22. The error correction circuit 24 also corrects the data read out from the flash memory 21 and written in the register 23 for errors.

The converting unit 251 converts the area management information of the management information read out from the register 23 into an area management flag, while converting the area management flag read out from the flash memory 21 into the original area management information.

If, for example, a 1-bit error is produced in the area management flag read out from the flash memory 21 and routed to the converting unit 25, the error correction unit 26 corrects the area management flag for errors. That is, the possible range of error correction of the error correction unit 26 is pre-set such that the error correction unit 26 performs correction for a 1-bit error. That is, the area management flag specifying an error is classified into a flag indicating an error correctable by the error correction unit 26 and a flag indicating an error uncorrectable by the error correction unit 26. Thus, the area management information converted by the converting unit 25 from the area management flag is classified into the area management information not corrupted by errors, the area management information corrected for errors and the area management information corrupted by errors and cannot be corrected for errors.

The controller 27 controls the operation of the memory card 20 based on the control data sent from the S/P-P/S interfacing circuit 22. That is, the controller 27 reads out data or the management information temporarily written in the register 23 from the register 23 in accordance with the write command routed from the S/P-P/S interfacing circuit 22 to store the read-out data or information in the flash memory 21. Of the management information, the area management information is first routed to the converting unit 25 where it is converted to an area management flag which is stored in the flash memory 21.

Also, the controller 27 reads out data or the management information from the flash memory 21 in accordance with the read-out command from the S/P-P/S interfacing circuit 22 to write the read-out data or information in the register 23. At this time, the controller 27 first sends the area management flag of the management information read out from the flash memory 21 to the converting unit 25 where it is converted into the area management information which is written in the register 23. It is noted that, in writing the area management information converted by the converting unit 25 in the register 23, the controller 27 appends to this area management information a flag for discriminating whether the area management information is not corrupted with errors as described above, the area management information corrected for errors or the area management information corrupted with errors and which cannot be corrected for errors.

To the controller 27 is connected a mistaken erasure inhibiting switch 28. If this mistaken erasure inhibiting switch 28 is on, the controller-27 does not perform control of erasing data stored in the flash memory 21 even if control data commanding erasure of data stored in the flash memory 21 is sent from the data processing device 10. Thus, it is possible with the memory card 20 to switch by the mistaken erasure inhibiting switch 28 between the state in which the data stored in the flash memory 21 can be erased and the state in which the data stored in the flash memory 21 cannot be erased.

If the data, area management information or the write command to be stored is sent from the data processing device 10 to the memory card 20, the S/P-P/S interfacing circuit 22 converts these data into parallel data which is sent to the controller 27. On the other hand, predetermined data or the management information is written in the register 23 under control by the controller 27.

To data or area management information written in the register 23, an error correction code for other than the area management information is appended by the error correction circuit 24.

Then, based on the write command sent from the S/P-P/S interfacing circuit 22, the controller 27 reads out defined data and management information from the register 23 to write the read-out data or information in the flash memory 21. Of the management information read out from the register 23, the area management information is first routed to the converting unit 25 under control by the controller 27. The area management information sent to the converting unit 25 is converted by this converting unit 25 to an area management flag. The controller 27 writes the area management flag converted by, the converting unit 25 in the flash memory 21.

When supplied with a read out command from the data processing device 10 to the memory card 20, the S/P-P/S interfacing circuit 22 routes the readout command to the controller 27.

The controller 27 then reads out data or the management information from the flash memory 21 to write the data or information in the register 23 under the read out command sent from the S/P-P/S interfacing circuit 22. At this time, the controller 27 first routes the area management flag read out from the flash memory 21 to the converting unit 25. The area management flag sent to the converting unit 25 is converted by this converting unit 25 to the area management information. If there is error correctable by the error correction unit 26 in the area management flag, the controller 27 sends this area management flag to the error correction unit 26. The controller 27 appends to the area management information corrected for errors by the error correction unit 26 a flag specifying the fact that the information has been corrected for errors to write the resulting data in the register 23.

If the data management information of the data or the management information written in the register 23 is corrupted with errors, the error correction circuit 24 connected to this register 23 corrects these errors based on the error correction code.

The S/P-P/S interfacing circuit 22 reads out the data or the area management information from the register 23 under control by the controller 27 to convert the data or information into serial data which is sent out to the data processing device 10.

Although the foregoing description has been made of appending a flag indicating the fact of error correction to the area management information corrected for errors, it is similarly possible to append a flag specifying the fact of error correction to the data or data management information corrected for errors.

In addition, although the foregoing description has been made of a system in which the error correction circuit 24 is provided in the memory card 20 and data or the data management information is corrected for errors in the memory card 20, the present invention is also applicable to a system in which the data processing device has an error correction circuit and the data of the data management information is corrected for errors on the side of the data processing device. In this case, it is the data having appended error correction codes that is exchanged between the data processing device 10 and the memory card 20.

The structure of the storage area of the flash memory 21 loaded on the memory card 20 is hereinafter explained.

Figure 3:
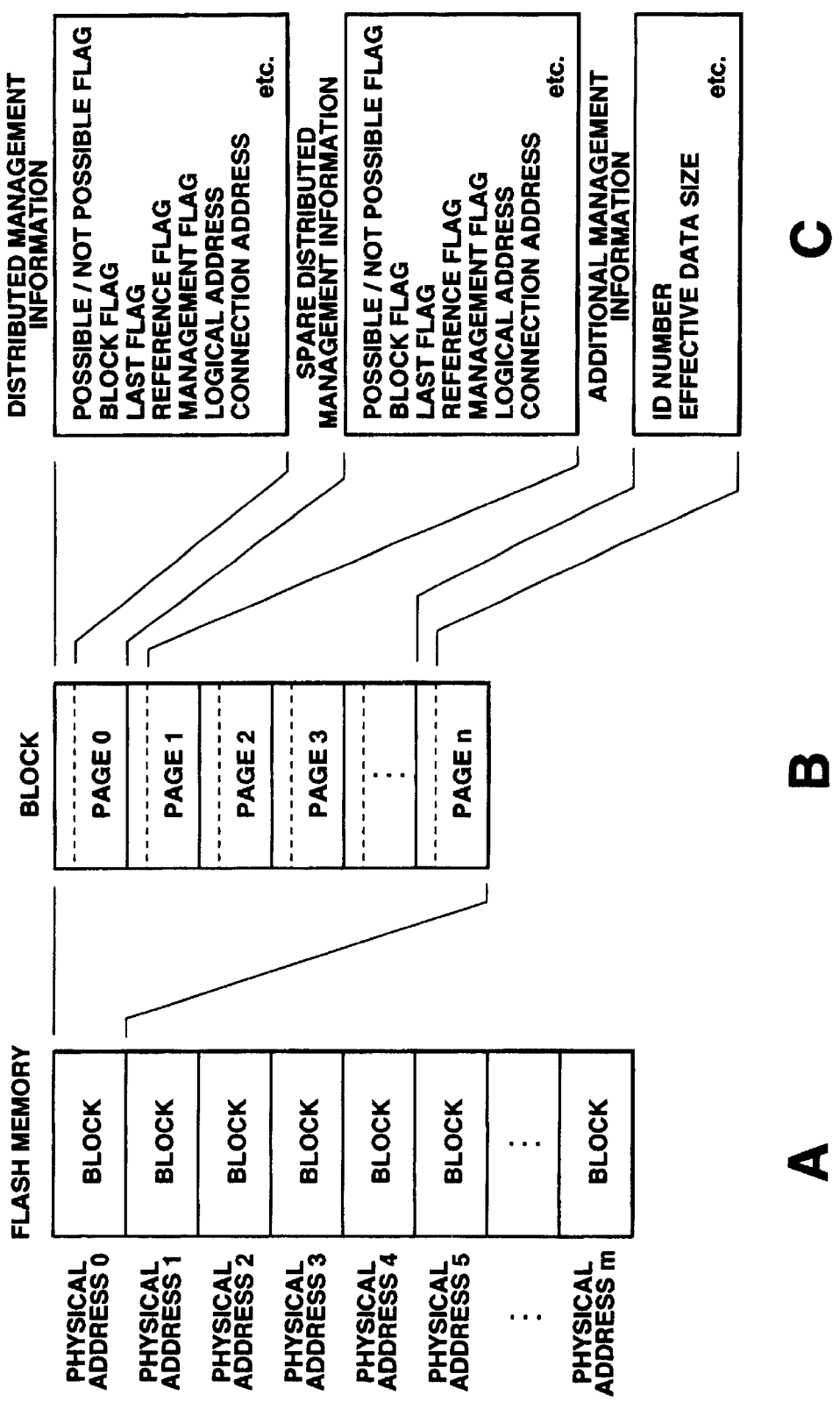
FIG. 3 is a schematic view showing the structure of a storage area of a flash memory.

The storage area of the flash memory 21 is made up of a large number of cells as storage units and is split into plural blocks as data erasure units, as shown in FIG. 3a. These blocks are classified into boot blocks, into which are stored boot data, that is data initially read by the data processing device 10 on starting the memory card 20, and data blocks into which are written optional data. To these blocks are allocated physical addresses proper to the respective blocks.

Each block is a data erasure unit and simultaneously the minimum unit for file management. That is, the file is stored in one or plural blocks and is designed so that the same block cannot be utilized by plural files.

Each block is composed of plural cells in each of which the information that can take two states denoting "1" and "0" is stored.

In the initial state, all bits of each block are set to "1" such that bit-based change is possible only from "1" or "0". Therefore, if data made up of "1"s and "0"s is to be written in the flash memory 21, the bits for "1" are kept, while bits for "0" are changed from "1" to "0" prior to data writing.

If data, once written, is erased from the flash memory 21, data are initialized in a lump on the block basis to set all bits of the block to "1". This erases the data written in the block in a lump so that the block is again in the state of allowing for data writing.

Each block of the flash memory 21 is made up of plural pages as data writing or readout unit, as shown in FIG. 3b. Each page represents a storage unit having a recording capacity of, for example, 512 bytes. When writing data in the flash memory 21, data read out from the register 23 on the page unit is written on the page basis in the flash memory 21. When reading out data from the flash memory 21, data are read out by the controller 25 on the page basis and thence sent to the register 23.

Each page representing a data writing or readout unit has a data storage area and a management information storage area. The data storage area means an area in which to write optional data, and the management information storage area means an area in which to store the information required for management of data written in the data storage unit (management information).

The management information storage area has an area of 16 bytes, of which the first three bytes are set as an overwrite area for which the information can be rewritten without block-based lumped initialization. The remaining 13 bytes of the management information storage area are set as a usual area for block-based lumped initialization at the time of rewriting the information.

The management information is stored in the management information storage area of each page constituting a block. Specifically, the so-called distributed management information, as the information necessary for management of the block in question, is stored in the management information storage area in the beginning page of each block, as shown in FIG. 3c. There is also stored, as the spare distributed management information, the same management information as the distributed management information stored in the management information storage area of the beginning page in the management information storage area of each page as from page 2 of each block it is noted that the so-called additional management information for eking out the otherwise deficient information is stored in the management information storage area of the last page of each block.

Thus, the distributed management information for supervising the respective blocks is stored in the management information storage area in each block in the flash memory 21 loaded on the memory card 20. The information as to whether or not the block in question is the leading end block of the file and, if the file is constituted by plural files, the information specifying the block linkage, can be acquired by this distributed management information.

By collecting the distributed management information of each block, the memory card 20 formulates the so-called collective management information as the information for supervising the flash memory 21 in its entirety in order to store the collective management information as a file in the flash memory 21.

If data is to be exchanged between the data processing device 10 and the memory card 20, the data processing device 10 usually reads out the collective management information from the flash memory 21 to obtain the information required for accessing each block. This eliminates the necessity of accessing to the distributed management information stored in each block for each data accessing to enable more expeditious data accessing.

The distributed management information, additional management information and the collective management information will be explained more specifically.

Figure 4:
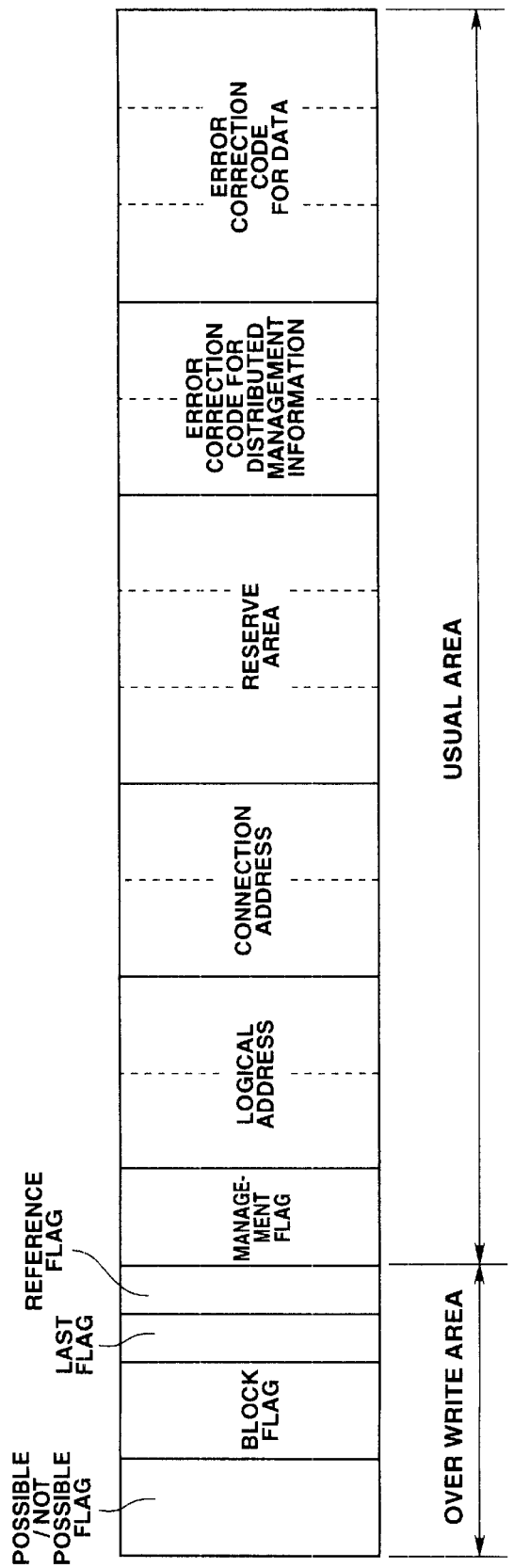
FIG. 4 is a schematic view for illustrating the distributed management information.
Figure 6:
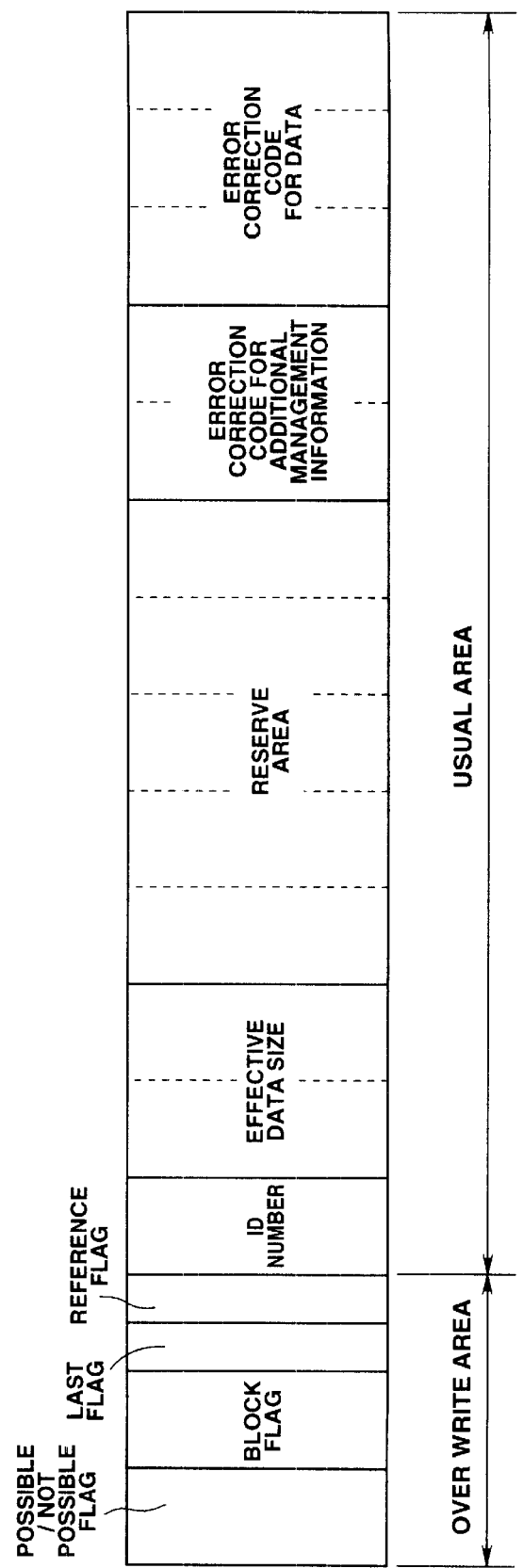
FIG. 6 is a schematic view for illustrating the additional management information.

The distributed management information is the management information for block management stored in a 16-byte management information storage area provided in each page. This distributed management information is made up of a 1-byte possible/not possible flag, a 1-byte block flag, a 4-bit last flag, a 4-bit reference flag, a 1-byte management flag, a 2-byte logical address, a 2-byte connection flag, a 2-byte distributed management information error correction code and a 3-byte data error correction flag, as shown in FIG. 4. Of these flags, the possible/not possible flag, block flag, last flag and the reference flag are stored in the initial 3-byte overwrite area of the management information storage area.

In the usual 13-byte area of the management information storage area are stored the management flag, logical address, connection addresses, reserve area, error correction code for distributed management information and the error correction code for data. The remaining 3 bytes of the usual area are set as a reserve area.

The possible/not possible flag denotes whether a block is in the usable state or in the non-usable state. That is, if an error that cannot be recovered is produced in a block, the possible/not possible flag specifies that the block in question is in the non-usable state.

The block flag specifies the usable state of the block. Specifically, the block flag indicates four states of "not used as yet", "used at the leading end", "used" and "not erased as yet". Of these, the block flag "not used as yet" specifies that the block is not used as yet or already erased and is in an initial state, with all bits being "1", such that data can be written at once. The block flag "used at the leading end" specifies that the block in question is used at the leading end of the file. The block flag "used" specifies that the block i question is being used in other than the leading end of the file. That is, if the block flag is "used", it indicates that the block in question is connected from other blocks. The flag "not erased as yet" specifies that data written in the block is not needed. In the blot block holding boot data, a boot flag is "used at the leading end".

In the present memory card 20, if unneeded data stored in the block is erased, the block flag is first set to the "non-erased" state and, if there is allowance in the processing time, the block whose block flag is "not erased as yet" is erased. This permits the memory card 20 to perform data erasure processing more efficiently.

The last flag is a flag indicating whether or not the file terminates with the block in question and specifically is a flag specifying two states, namely a "blocks continuing" and "last block". The state "blocks continuing" specifies that the files stored in the block in question are not depleted and continue to other block(s). The state "last block" specifies that the file stored in the block in question terminates with this block.

The flag "reference" is a flag for designating reference to the additional management information and specifically showing the two states of "no reference information exists" and "reference information exists". The state "no reference information exists" specifies that there is no effective additional management information in the management information storage area of the last page of the block. The state "reference information exists" specifies that there exists the effective additional management information in the management information storage area of the last page of the block.

The management flag specifies block attributes and, as an example, specifies an attribute such as the block being a read-only block or an attribute such as the block being also writeable. This management flag indicates whether the block in question is a boot block or a data block.

The logical address specifies the logical address of the block in question. The value of the logical address is updated as the occasion may demand for e.g., data rewriting. Meanwhile, the values of the logical addresses are set so that the same value of the logical address will not be owned simultaneously by plural blocks.

The connection address specifies the logical address of other blocks connected to the connection block. That is, if the file connected to the block in question connects to other block(s), the connection address indicates the value of the logical address in which the remaining portion of the file is stored.

The error correction code for the distributed management information is the error correction code for data of the distributed management information written in the management flag, logical address, connecting address and in the reserve area.

The error correction code for data is the error correction code for data stored in the data storage area of a page in which has been written the error correction code for data.

The possible/not possible flag, block flag, last flag and the reference flag of the above-mentioned distributed management information represent the information for supervising the state of the data storage area, that is the area management information. Since there arises the necessity for rewriting the reference flag independently of data, it is not subjected to error correction by the error correction-code for the above-mentioned distributed management information and is stored in the management information storage area as a flag (area management flag) having redundant data of a defined amount of the same code as the code specifying the information item in order to combat errors.

Specifically, these items of the area management information are converted by the converting unit 25 into the area management flag having appended redundant data and is stored in an overwrite area of the management information storage area as the 4-bit information for the original 1-bit information and as the 8-bit information for the original 2-bit information, as shown in FIG. 5.

That is, the possible/not possible flag is denoted by the 1-bit information "1" and the 1-bit information "0" if the block is in the usable state or in the unusable state, respectively. For storage in the management information storage area, the possible/not possible flag is converted to, for example, the 1-byte information "11111111" or "00000000" by appendage of redundant bits prior to storage.

The block flag is denoted by the 2-bit information "11", "10", "01" and "00" if the block is "not used as yet", "used at the leading end", "used" and "not erased as yet", respectively. For storage in the management information storage area, the block flag is converted to, for example, the 1-byte information "1111 1111", "1111 0000", "0000 1111", "0000 0000" by appendage of redundant bits for storage.

The last flag is denoted by the 1-bit information "1" and the 1-bit information "0" for "blocks continuing" and "last block", respectively. For storage in the management information storage area, the last flag is converted by appendage of redundant data into, for example, the 4-bit information "1111" or "0000" prior to storage.

The reference flag is denoted by the 1-bit information "1" and the 1-bit information "0" if "there is no reference information" and if "there exists reference information", respectively. For storage in the management information storage area, the reference flag is converted into, for example, the 4-bit information "1111" or "0000" prior to storage.

Since the area management information is stored in the management information storage area as an area management flag having the redundant data appended thereto, the original area management information can be recognized by comparing the numbers of "1"s and "0"s of the area management flag even if an error is produced as a result of malfunctions of the cell holding the flag in question.

The additional management information is the information stored in the 16-byte management information storage area of the last page of the block, and includes the additional information for eking out otherwise insufficient information.

This additional management information is made up of, for example, a 1-byte possible/not-possible flag, a 1-byte block flag, a 4-bit last flag, a 4-bit reference flag, a 1-byte identification number, a 2-byte effective data size, a 2-byte error correction code for the additional management information and a 3-byte error correction code for data.

The possible/not-possible flag, block flag, last flag, reference flag and the error correction code for data are similar to those for the distributed management information. The error correction code for the additional information is equivalent to the error correction code for the distributed management information and is used for the identification number excluding the area management flag of the additional management information, effective data size and data written in the reserve area.

The identification number and the effective data size are included in the additional management information as the additional information which ekes out the otherwise deficient distributed management information.

Similarly to the distributed management information, the additional management information is the area management information such as possible/not-possible flag, block flag, last flag and the reference flag, as the area management flag, having the appended redundant data, and is stored in the overwrite area of the first three bytes of the management information storage area.

In the 13-byte usual area of the management information storage area are stored the identification number, effective data size, error correction code for additional management information and the error correction code for data. The remaining 5 bytes of the usual area are set as a reserve area.

The identification number is the information for error processing. The value of the identification number is incremented each time the block data is rewritten. If an error of some sort is produced such that there exist plural blocks having the same logical addresses, the identification number is used for discriminating whether the data written in these blocks is new or old. Meanwhile, a 1-byte area is used for the identification number, its value ranging from "0" to "255", with the initial value, that is the value of the identification number initially set when using the new logical address, being "0". If the identification number exceeds 255, it is reset to 0. If there exist plural blocks having the same logical number, a block having a smaller value of the identification number is valid. As for the boot block, such block having the same identification number as the backup is the normal value. If the two values differ, a larger value is used.

The effective data sizes indicates the size of effective data in a block. That is, if there is vacancy in the data storage area in the block, the effective data size specifies the value of the size of data written in the data storage area n question. At this time, the reference flag is set to "reference information exists". If there is no vacancy in the data storage area in the block, the effective data size is set to "0xffff" as the information specifying that there is no vacancy in the data storage area in the block.

Meanwhile, the above described distributed management information and the additional management information are updated each time the in-block data is updated so as to represent the latest information.

Figure 7:
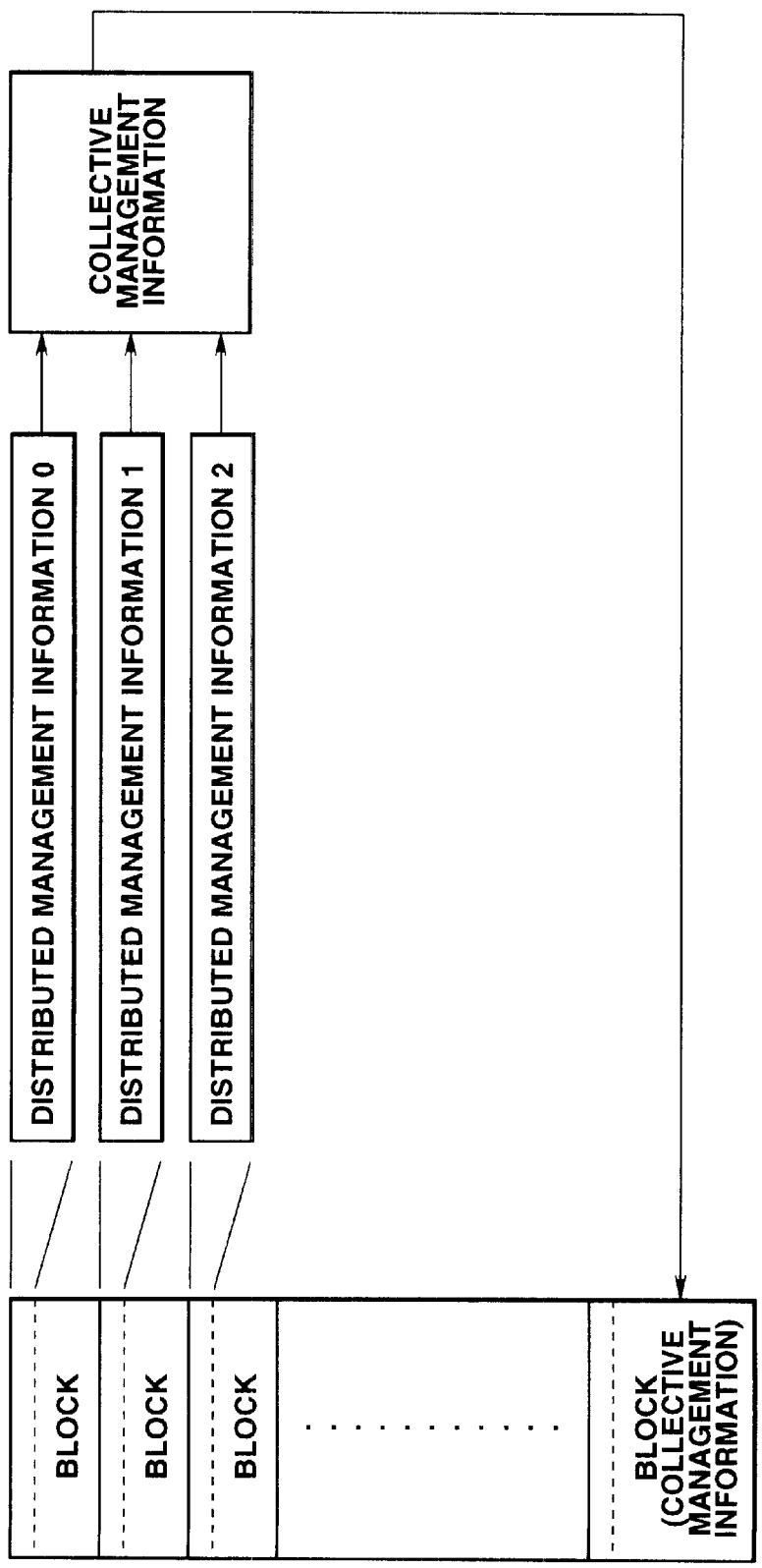
FIG. 7 is a schematic view for illustrating the structure of the collective management information.

The collective management information is the information formulated by collecting the distributed management information of each block and is stored as a file in the flash memory 21. That is, a file of the collective management information, which is the information for management of all files, collected together, is formulated from the distributed management information of all blocks, and stored in a data storage area of a defined block, as shown in FIG. 7. The collective management information may be stored in a sole block, or across plural blocks. The data processing device 10 usually acquires the information for accessing to each block by this collective management information.

That is, if the collective management information effective for the memory card 20 is stored as a file, the data processing device 10 reads out the file of the collective management information to formulate a management table for supervising the memory card 20. Meanwhile, the physical address of the block, in which is stored the leading end of the file of the collective management information, is contained in a boot address. The data processing device 10 accesses to the file of the collective management information basted on this physical address.

Figure 8:
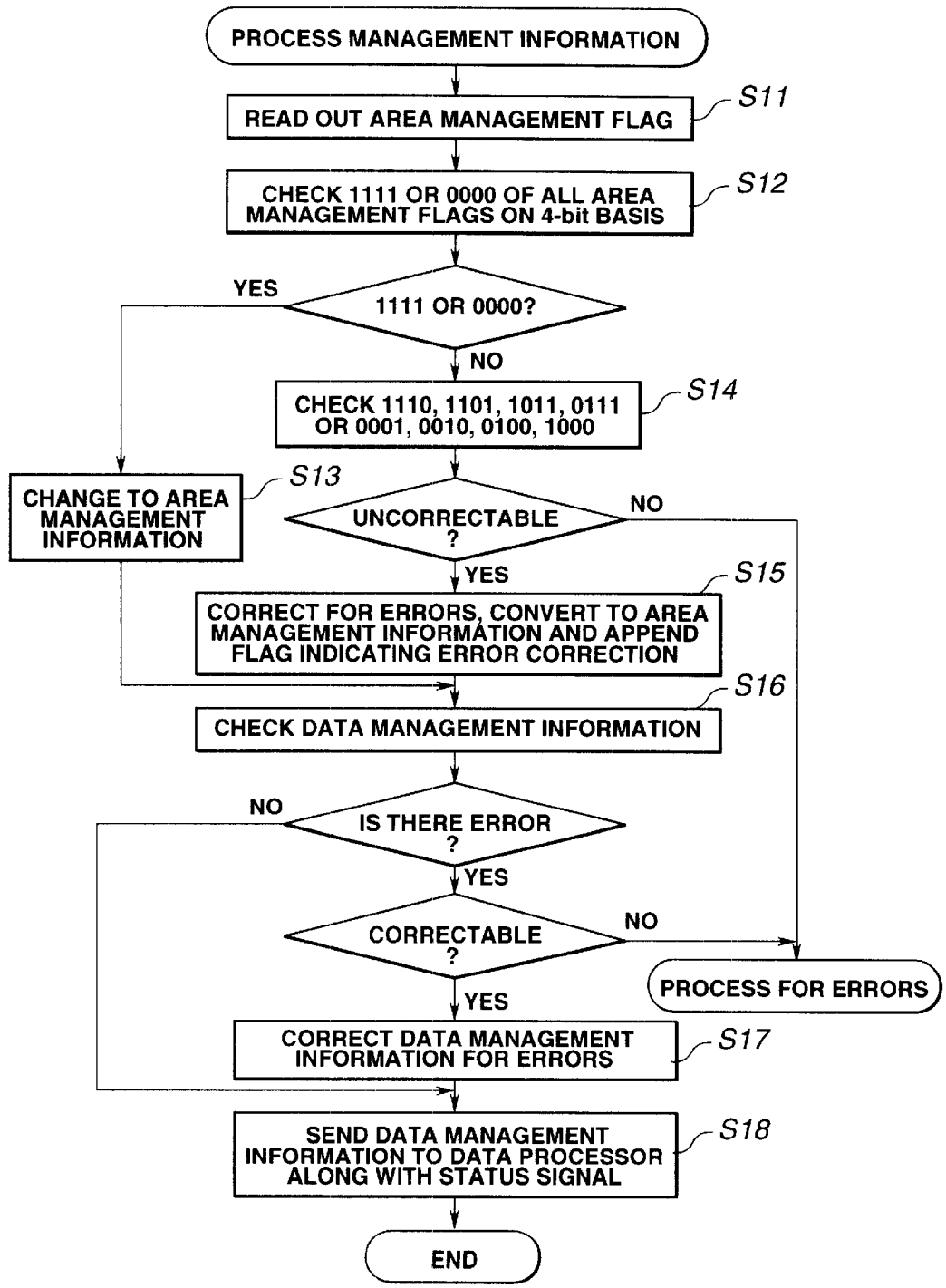
FIG. 8 is a flowchart for illustrating an example of the readout processing for the area management information in a memory card.

Referring to FIG. 8, illustrative processing of transmitting the management information read out from the flash memory 21 of the memory card 20 to the data processing device 10 is hereinafter explained. It is noted that data processing shown in FIG. 8 represents an instance in which the area management information is converted into a 4-bit-based area management flag which is stored in the flash memory 21 and that the data processing in the memory card according to the present invention is not limited to this illustrative case. The data processing shown in FIG. 8 shows an instance in which, if the area management information is corrected for errors, a flag specifying this effect is appended to the area management information and the resulting data is transmitted. In data processing in the memory card according to the present invention, it is also possible to append a flag indicating the fact of error correction of the data management information and to transmit the resulting data in case the data management information has been corrected for errors.

For reading out the management information from the flash memory 21 of the memory card 20, an area management flag is read out at step S11 by the controller 27 from the flash memory 21.

Then, at step S12, all of the area management flags are checked on the four-bit basis by the controller 27 as to whether the area management flag is "1111" or "0000".

If the area management flag is "1111" or "0000", the program shifts to step S13 where the area management flag is converted to the area management information by the converting unit 25 before the program shifts to step S16.

If the area management flag is not "1111" or "0000", the program shifts to step S14. It is checked at step S14 by the controller 27 whether the area management flag is "1110", "1101" "1011" or "0111" or whether it is "0001", "0010", "0100" or "1000".

If it is found that the area management flag is none of 1110", "1101", "1011" "0111" nor "0001", "0010", "0100", "1000", error processing is executed.

If it is found that the area management flag is one of 1110", "1101", "1011" "0111" or one of "0001", "0010", "0100", "1000", the program shifts to step S15 where error correction is executed by the error correction unit 26. The error correction unit 26 executes error correction by comparing the numbers of "0"s and "1"s of the area management flag. If the area management flag is any one of 1110", "1101", "1011" "0111", the error correction unit 26 corrects the flag to "1111" to output the corrected flag to the converting unit 25. If the area management flag is any one of "0001", "0010", "0100", "1000", the error correction unit 26 corrects the flag to "0000" to output the corrected flag to the converting unit 25. The area management flag is converted in this manner by the converting unit 25 to the area management information. To this area management information is appended a flag specifying the fact of error correction for thee area management information before the program shifts to step S16.

At step S16, the data management information is checked as to possible presence of errors.

If it is found that there exists no error in the data management information, the program shifts to step S18.

If it is found that the data management information is corrupted with errors, it is checked whether or not the errors can be corrected. If it is found that the errors cannot be corrected, the program shifts to step S17 to correct the errors by the error correction circuit 24 before the program shifts to step S18.

At step S18, the area management information and the data management information are transmitted by the S/P-P/S interfacing circuit 22 to the data processing device 10 along with the status signal.

Figure 9:
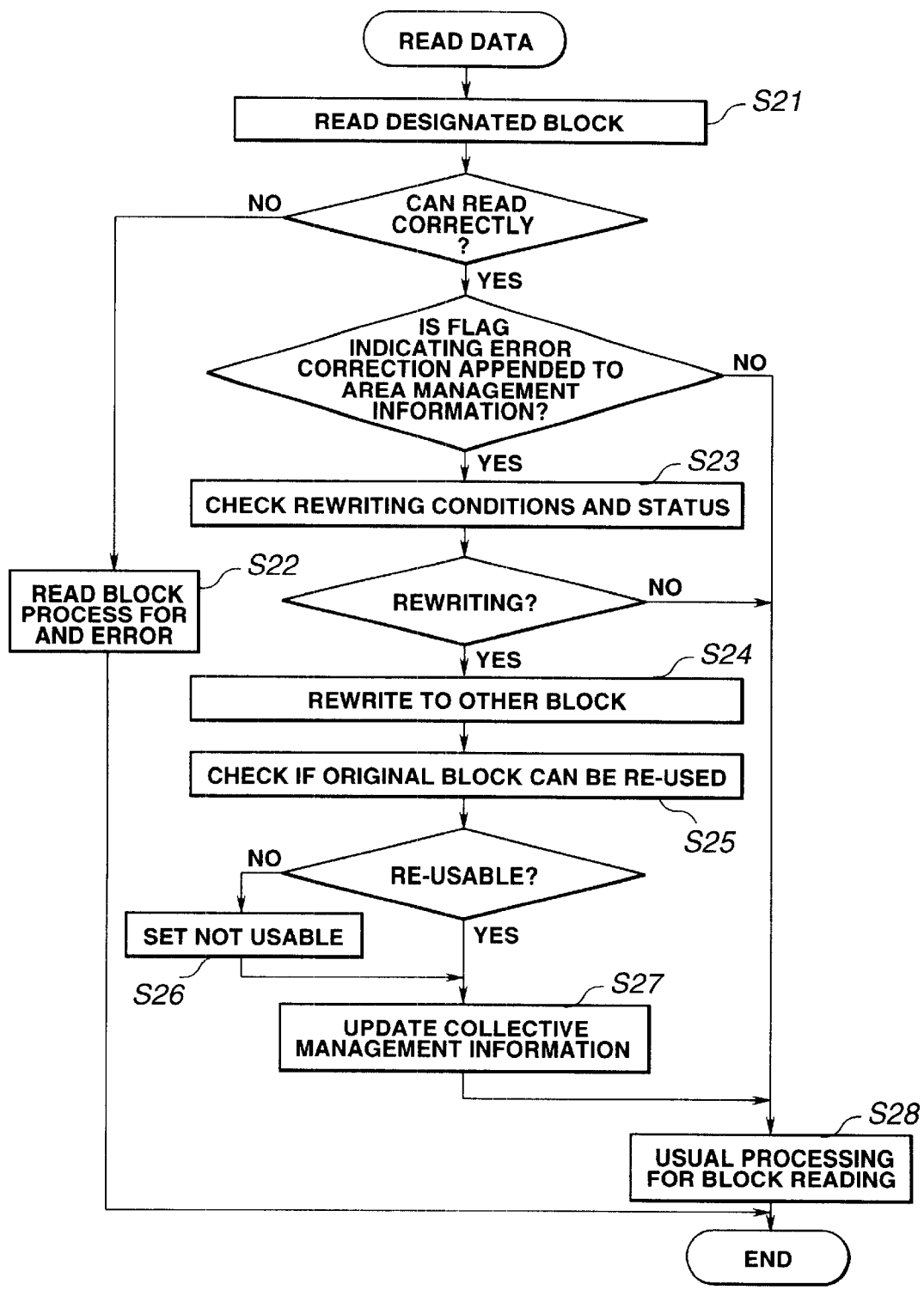
FIG. 9 is a for illustrating an example of data processing in a data processing device.

An illustrative operation of the data processing device 10 reading data and the management information transmitted from the memory card 20 to perform defined processing thereon is explained with reference to FIG. 9. It is noted that data processing by the data processing device shown in FIG. 9 is performed on the basis of a flag appended to the area management information transmitted from the memory card 20 to indicate the fact of error correction thereon. However, data processing by the data processing device according to the present invention may also be that performed on the basis of a flag occasionally appended to the data management information.

It is noted that data processing by the data processing device shown in FIG. 9 is the processing in which, if a flag specifying the fact of error correction is appended to the area management information of the read-out block, this block is rewritten to another block. The data processing by the data processing device according to the present invention is not limited to this illustrative processing since defined processing can be performed on the basis of the flag occasionally appended to the area management information corrected for errors.

When the data processing device 10 performs defined data processing on the data and management information transmitted from the memory card 20, a designated block is read at step S21 by the serial interfacing circuit 12. It is then checked whether the designated block can be read correctly. If the designated block cannot be read correctly, the program shifts to S22 to process block reading errors by the controller 14.

If the designated block has been read correctly, it is checked whether or not a flag specifying the fact of error correction is appended to the area management information of the read-out block. If it is found that such flag is not appended to the area management information, the program shifts to step S28 to perform normal block readout processing.

If it is found that such flag is appended to the area management information, the program shifts to step S23 where the controller 14 checks the condition and the state of block rewriting. If it is found that block rewriting is not made, the program shifts to step S28 in order to effectuate normal block read-out processing. If it is found that block rewriting is not made, the program shifts to step S24 where the controller 14 rewrites the read-out block to another block. The program then shifts to step S25.

At step S25, the controller 14 checks the possibility of re-utilization of the original block. If it is found that the original block cannot be re-utilized, the program shifts to step S26 where the controller 14 sets use addition for the original block. The program then shifts to step S27.

If it is found that the original block can be re-utilized, the program shifts to step S27 where the controller 14 updates the collective management information.

If the collective management information is updated, the controller 14 performs at step S28 the normal block readout processing to terminate the data readout processing.

Thus, if the area management information stored in the memory card 20 has been corrected for errors, the system 1 of the present invention appends a flag specifying the fact of error correction to the area management information to output the resulting data to the data processing device 10. On the other hand, if a flag specifying the fact of error correction by the data processing device 10 is appended to the area management information transmitted from the memory card 20, the system 1 of the present invention performs defined data processing based on this flag. For example, a block having the area management information corrected for errors may be rewritten to another block to improve data reliability.

What is claimed is:

1. A storage device for processing data stored in a memory of the storage device, comprising:
   a register for storing data retrieved by a controller from said memory;
   a converter for retrieving an area management flag corresponding to the data retrieved from said memory; said area management flag having redundant information bits for error correction;
   an error correction unit connected to said converter for detecting and correcting errors in said area management flag;
   said converter converting the area management flag into area management information; said converter appending a flag to the area management information when an error has been corrected in said area management flag by said error correction unit; and
   an interface unit for outputting the data from the register and the area management information corresponding to the data from the converter to an external data processing device.

2. The storage device according to claim 1, further comprising an error correction code unit for detecting and correcting errors in the data stored in said register.

3. The storage device according to claim 1, wherein said error correction unit corrects errors in said area management flag when the redundant information bits are not the same.

4. The storage device according to claim 1, wherein said memory is a flash memory comprised of a plurality of blocks; each block being comprised of plural pages.

5. A method of processing data stored in a storage device, comprising the steps of:
   retrieving data stored in a memory of said storage device and storing the retrieved data in a register;
   retrieving an area management flag corresponding to the data retrieved from said memory into a converter; said area management flag having redundant information bits for error correction;

detecting and correcting errors in said area management flag using an error correction unit;

converting the area management flag into area management information;

appending a flag to the area management information when an error has been corrected in said area management flag by said error correction unit; and outputting the data from the register and the area management information corresponding to the data from the converter to a data processing device.

6. The method according to claim 5, further comprising the step of detecting and correcting errors in the data stored in said register using an error correction code unit.

7. The storage device according to claim 5, wherein said error correction unit corrects errors in said area management flag when the redundant information bits are not the same.

8. The storage device according to claim 5, wherein said memory is a flash memory comprised of a plurality of blocks; each block being comprised of plural pages.

9. A data processing device for processing data output from a storage device, comprising:

an interface unit for retrieving data output from said storage device and area management information corresponding to the data; said area management information indicating a block of memory in said storage device where the data and area management information is stored;

a data processor for detecting a flag appended to said area management information; said flag indicating that an error in said area management information was corrected by said storage device; said data processor determining whether said block of memory in said storage device where the retrieved data is stored is usable if said flag is detected, and said data processor updating the area management information if said block is determined to be not usable; and said interface unit outputting the data and updated area management information to said storage device for storage in a different block of memory.

10. A method of processing data output from a storage device using a data processing device, comprising the steps of:

retrieving data output from said storage device and area management information corresponding to the data; said area management information indicating a block of memory in said storage device where the data and area management information is stored;

detecting a flag appended to said area management information; the flag indicating an error in said area management information was corrected by said storage device; and determining, when said flag is detected, whether said block of memory in said storage device where the retrieved data is stored is usable; updating the area management information if said block is not usable and outputting the data and updated area management information to said storage device for storage in a different block of memory.

11. A storage device for processing data stored in a memory of the storage device, comprising:

a register for storing data retrieved by a controller from said memory;

a converter for retrieving an area management information corresponding to the data and converting the area management information into an area management flag having redundant information bits for error correction; and controller for writing the area management flag into said memory.

12. The storage device according to claim 11, further comprising an error correction code unit for detecting and correcting errors in the data stored in said register.

13. The storage device according to claim 11, further comprising an error correction unit connected to said converter for detecting and correcting errors in said area management flag when the redundant information bits are not the same.

14. The storage device according to claim 11, wherein said memory is a flash memory comprised of a plurality of blocks; each block being comprised of plural pages.

* * * * *